(12) United States Patent
Budd et al.

(10) Patent No.: US 7,780,063 B2
(45) Date of Patent: Aug. 24, 2010

(54) TECHNIQUES FOR ARRANGING SOLDER BALLS AND FORMING BUMPS

(75) Inventors: Russell A. Budd, North Salem, NY (US); Frank R. Libsch, White Plains, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/121,236

(22) Filed: May 15, 2008

(65) Prior Publication Data
US 2009/0283575 A1    Nov. 19, 2009

(51) Int. Cl.
*B23K 31/02* (2006.01)

(52) U.S. Cl. .............. 228/180.22; 228/215; 228/219; 228/246

(58) Field of Classification Search ............ 228/41, 228/245; 438/616
See application file for complete search history.

(56) References Cited

U.S. PATENT DOCUMENTS

| | | | |
|---|---|---|---|
| 5,244,143 A | | 9/1993 | Ference et al. |
| 5,284,287 A | | 2/1994 | Wilson et al. |
| 5,431,332 A | * | 7/1995 | Kirby et al. ............. 228/246 |
| 5,540,377 A | | 7/1996 | Ito |
| 5,775,569 A | | 7/1998 | Berger et al. |
| 5,976,965 A | | 11/1999 | Takahashi et al. |
| 5,985,694 A | | 11/1999 | Cho |
| 6,213,386 B1 | | 4/2001 | Inoue et al. |
| 6,460,755 B1 | | 10/2002 | Inoue et al. |
| 6,571,007 B1 | | 5/2003 | Shimokawa et al. |
| 6,732,912 B2 | * | 5/2004 | Tong et al. ............. 228/246 |
| 6,745,450 B1 | | 6/2004 | Bolde |
| 6,919,634 B2 | | 7/2005 | Kuramoto et al. |
| 7,332,424 B2 | | 2/2008 | Belanger et al. |
| 2002/0157612 A1 | * | 10/2002 | Shih et al. ............. 118/726 |
| 2003/0127501 A1 | * | 7/2003 | Cheng et al. ........... 228/246 |
| 2005/0056681 A1 | * | 3/2005 | Cobbley et al. ......... 228/41 |
| 2007/0099411 A1 | * | 5/2007 | Matsui et al. ........... 438/612 |
| 2008/0142969 A1 | * | 6/2008 | Hakuno ................. 257/738 |
| 2008/0196226 A1 | * | 8/2008 | Aoya .................... 29/25.01 |

OTHER PUBLICATIONS

P.A. Gruber et al., Low-cost wafer bumping, IBM J. Res. & Dev. vol. 49 No. 4/5, Jul./Sep. 2005, pp. 621-639.

* cited by examiner

*Primary Examiner*—Kiley Stoner
(74) *Attorney, Agent, or Firm*—Ryan, Mason & Lewis, LLP; Daniel P. Morris, Esq.

(57) ABSTRACT

A mask having a plurality of through holes and a mold having a plurality of cavities are provided, and the through holes and the cavities are aligned. Conductive balls are dispensed into the aligned through holes and cavities Substantially one ball is dispensed into each aligned through hole and cavity, and the mask with the holes and the cavities in the mold are configured and dimensioned such that the balls are substantially flush with, or recessed below, an outer surface of the mask. The mask is removed, the conductive balls are aligned with pads of a semiconductor device, and the conductive balls are transferred to the pads by fluxless reflow in a formic acid environment. Vibrational, electrostatic, and direct transfer aspects are also disclosed.

16 Claims, 7 Drawing Sheets

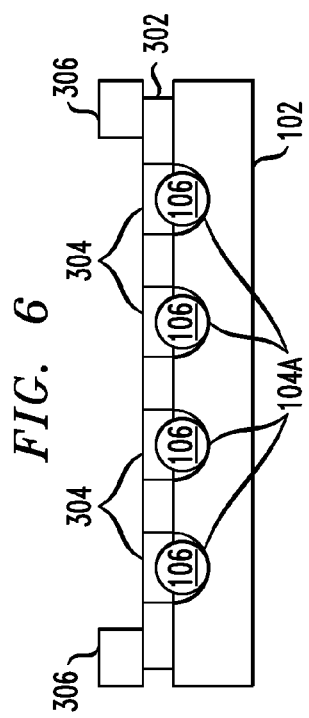
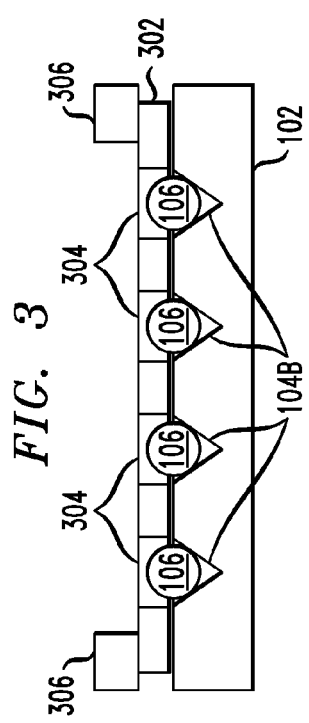
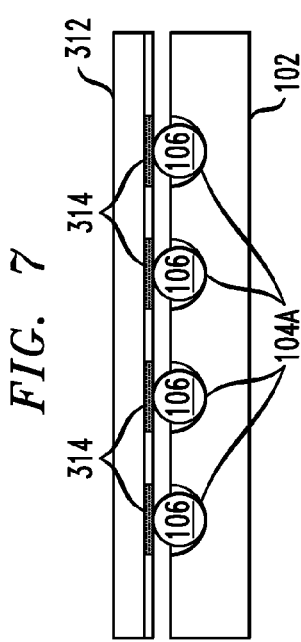
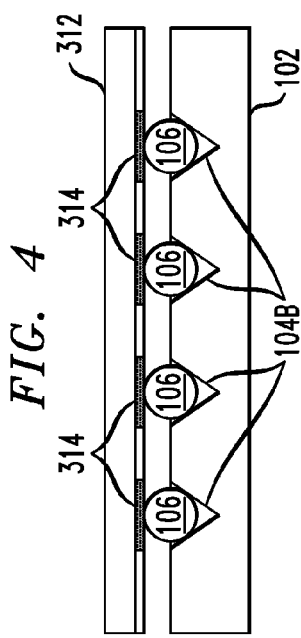
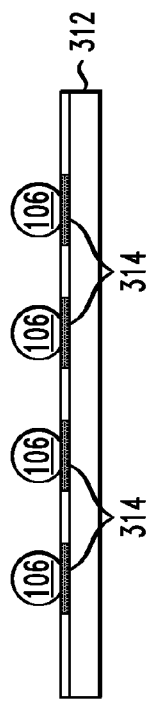

FIG. 17
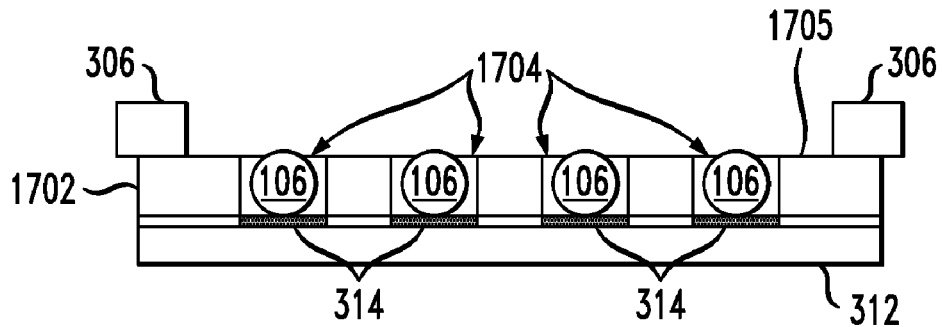
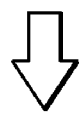
FIG. 18
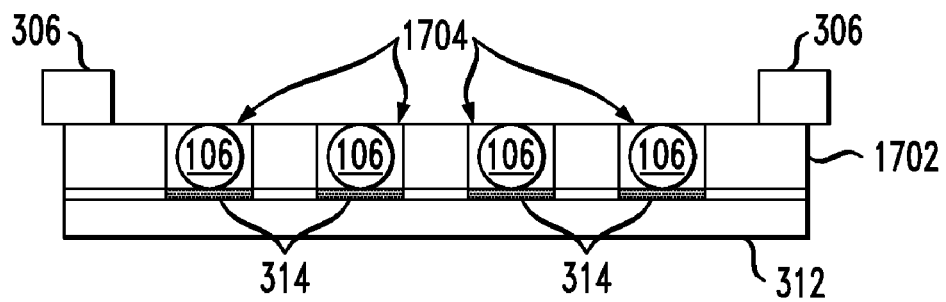
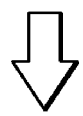
FIG. 19
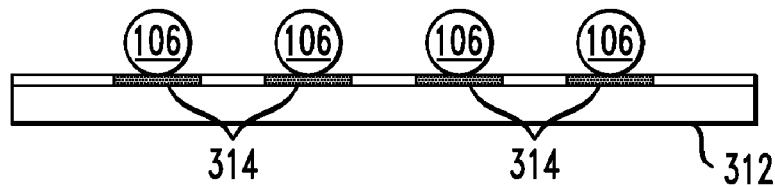

TECHNIQUES FOR ARRANGING SOLDER BALLS AND FORMING BUMPS

FIELD OF THE INVENTION

The present invention generally relates to the electrical and electronic arts and, more particularly, to techniques for forming electrical interconnections.

BACKGROUND OF THE INVENTION

There are many techniques that can be used for the fine pitch solder bumping process for so-called "flip chip" technology, including, for example, evaporation, electroplating, screen printing, hall drop, C4NP (Controlled Collapse Chip Connection—New Process), and so on.

As smaller solder bump interconnects, at finer pitch, are in great demand for flip chip technology, the ball drop method and C4NP, which eliminate the volume reduction problem, and which have solder alloy flexibility, have recently gained visibility and attention in the industry Around 50% volume reduction between solder pastes and final solder bumps after reflow makes it difficult to apply the screen printing method for fine pitch applications The electric current induced composition control can not handle wide alloy range in electroplating method. The ball drop method and C4NP allow finer pitch and a larger number of pins than the screen printing method, and they also allow mole freedom in selecting the composition of solder bumps, in comparison to the electroplating method. Note that "pitch" refers to the distance between the centers of adjacent solder balls.

Since C4NP uses a solder transfer method from a glass mold to a silicon wafer after injecting and solidification of molten solder in the cavities of a glass mold, when considering the use of high melting temperature solders such as 97 weight % Pb–3 weight % Sn and 80 weight % Au–20 weight % Sn, there currently does not exist a suitable material for sealing the contact between an injection molded solder (IMS) head and a glass mold, because the temperature of the molten solder is too high when using high temperature solders.

Inoue et al, in U.S. Pat. No 6,213,386, disclose a method of forming bumps. Solder balls and a tool having a large number of through-holes are used, and under the condition that the through-holes of the tool are aligned with the pads of the semiconductor device, the solder balls are charged into the through-holes, pressed to be fixed on the pads, and then reflowed to form bumps.

Inoue et al, in U.S. Pat. No. 6,460,755, disclose a bump forming method and an apparatus therefor. In particular, it is stated that a solder bump forming method and an apparatus therefor achieve high reliability, and an electronic part, produced by this method and this apparatus, is also disclosed. For each of the step of arraying solder balls, the step of supplying a flux, and the step of mounting the solder balls on a board, it is checked whether or not any solder ball is omitted, and the process is conducted while confirming the condition of the operation, thereby enhancing the reliability and also preventing defective products from being produced.

Shimokawa et al., in U.S. Pat. No. 6,571,007, disclose a ball-arranging substrate for forming bump, ball-arranging head, ball-arranging device, and ball-arranging method. In particular, a ball-arranging substrate comprising a substrate with a main surface, a plurality of ball-arranging holes formed on the main surface for sucking and holding minute electroconductive balls at the locations corresponding to those of electrodes formed on a semiconductor device or a printed circuit board, wherein when light illuminates the ball-arranging surface to allow optical recognition of the arrangement of the minute electroconductive balls by means of the light reflected by the minute electroconductive balls and by the main surface, the wave length of the light of the light source is set in the range of 300 to 900 nm, and the reflectivity is made not more than 50% based on the light source A reflective mirror should be provided on the rear surface of the substrate opposite to the light source, in the case when the substrate is transparent to the irradiated light.

Bolde, in U.S. Pat. No. 6,745,450, discloses a method for loading solder balls in a mold Solder balls ate loaded into a reservoir having multiple exit ports. A removable mold is fitted into the apparatus and the reservoir is passed across the top of the mold while solder balls are fed into cavities in the mold. After the reservoir has advanced across the mold and the mold cavities are filled with solder balls, the reservoir is reset as a roller is simultaneously guided across the mold to seat the solder balls firmly within the mold. Alternatively, the roller may be applied to the solder balls while the reservoir advances across the mold, or both as the reservoir is advanced and when it is returned to its original position.

Takahashi et al, in U.S. Pat. No. 5,976,965, disclose a method for arranging minute metallic balls. In particular, a method for arranging metallic balls to form an array of bump electrodes comprises the steps of immersing a silicon template in ethanol and dropping metallic balls through the ethanol onto the template to receive the metallic balls in the holes of the template. The metallic balls are free from cohesion caused by electrostatic charge or moisture. The template may be inclined in the ethanol. The holes are formed by anisotropic etching a silicon plate.

Kuramoto et al, in U.S. Pat. No. 6,919,634, disclose a solder ball assembly, a method for its manufacture, and a method of forming solder bumps. In particular, a solder ball assembly includes a mask having first and second sides and a plurality of holes formed therein. Each hole has a first end opening onto the first side of the mask and a second end. A plurality of solder balls are disposed in the holes, and a fixing agent secures the solder balls in the holes. A protective sheet may be attached to one or both sides of the mask to cover the ends of the holes.

Kirby et al., in U.S. Pat. No. 5,431,332, disclose a method and apparatus for solder sphere placement using an air knife. A station in a manufacturing line for the accurate placement of solder balls on a ball grid array package and for the removal of excess solder balls comprises a substrate having an array of solder pads, and an adhesion layer on the solder pads. The station further comprises a stencil placed on top of the substrate and having a height between ¼ times the diameter of one of the solder balls and ⅝ times the diameter of one of the balls, the stencil having an array of apertures corresponding to the array of solder pads and substantially exposing each of the solder pads of the array, a pallet for holding and transporting the substrate to the stencil and further along the manufacturing line, a dispenser for pouring solder balls in bulk over the stencil, a vibration device coupled to the station for urging the solder balls into the apertures of the stencil and onto the adhesion layer above the solder pads, and a moving directed column of air across the surface of the stencil to remove excess solder balls from the stencil.

U.S. Pat. No. 5,985,694 of Cho discloses a semiconductor die bumping method utilizing vacuum stencil. U.S. Pat. No. 5,284,287 of Wilson et al. discloses a method for attaching conductive balls to a substrate. U.S. Pat. No. 5,540,377 of Ito discloses a solder ball placement machine.

SUMMARY OF THE INVENTION

Principles of the present invention provide techniques for arranging solder balls and forming bumps. An exemplary method includes the steps of providing a mask having a plurality of through holes and a mold having a plurality of cavities; aligning the through holes and the cavities; and dispensing conductive balls into the aligned through holes and cavities. Substantially one ball is dispensed into each aligned through hole and cavity, and the mask with the holes and the cavities in the mold ate configured and dimensioned such that the balls are substantially flush with, or recessed below, an outer surface of the mask. The mask is removed, the conductive balls are aligned with pads of a semiconductor device, and the conductive balls are transferred to the pads by fluxless reflow in a formic acid environment.

In another aspect, another exemplary method includes providing a mold having a plurality of cavities; and dispensing conductive balls into the cavities, substantially one ball to each cavity, by tipping and vibrating the mold. The cavities in the mold are configured and dimensioned such that the balls are substantially secured therein during the tipping and vibrating. The conductive balls are aligned with pads of a semiconductor device; and the conductive balls are transferred to the pads by fluxless reflow in a formic acid environment.

In still another aspect, still another exemplary method includes providing an electrically resistive mold having a plurality of cavities; and dispensing conductive balls into the cavities, substantially one ball to each cavity, by charging the balls to a first polarity and the mold to a second polarity different than the first polarity. An additional step includes aligning the conductive balls with pads of a semiconductor device, while a further step includes transferring the conductive balls to the pads by fluxless reflow in a formic acid environment.

In yet another aspect, yet another exemplary method includes providing a mask having a plurality of through holes; and aligning the through holes with pads of a semiconductor device. The mask and the semiconductor device have substantially similar coefficients of thermal expansion. A further step includes dispensing conductive balls into the holes, substantially one ball to each cavity, the through holes being configured and dimensioned such that the balls are one of substantially flush with, and recessed below, an outer surface of the mask. An additional step includes transferring the conductive balls to the pads by fluxless reflow in a formic acid environment.

These and other objects, features and advantages of the present invention will become apparent from the following detailed description of illustrative embodiments thereof, which is to be read in connection with the accompanying drawings.

BRIEF DESCRIPTION OF THE DRAWINGS

FIGS. 3-5 depict steps in an exemplary method, according to an aspect of the invention;

FIGS. 6 and 7 show exemplary alternatives to the steps of FIGS. 3 and 4;

FIGS. 17-19 show steps in an exemplary direct technique, according to an even further aspect of the invention.

DETAILED DESCRIPTION OF PREFERRED EMBODIMENTS

Current C4NP techniques require injection of molten solder. As noted, application of such techniques is limited for high-temperature cases, due to inability to find a suitable seal material. Aspects of the invention provide a method for arraying high melting temperature solder balls and forming solder bumps on a semiconductor device. The direct array of solder balls in the cavities of a mold plate, according to one or more embodiments of the invention, does not require any sealing materials (as in IMS). Accordingly, aspects of the invention provide techniques for placing high melting temperature solder balls into a C4NP mold plate to carry out a fluxless solder joining method.

Figure 1:
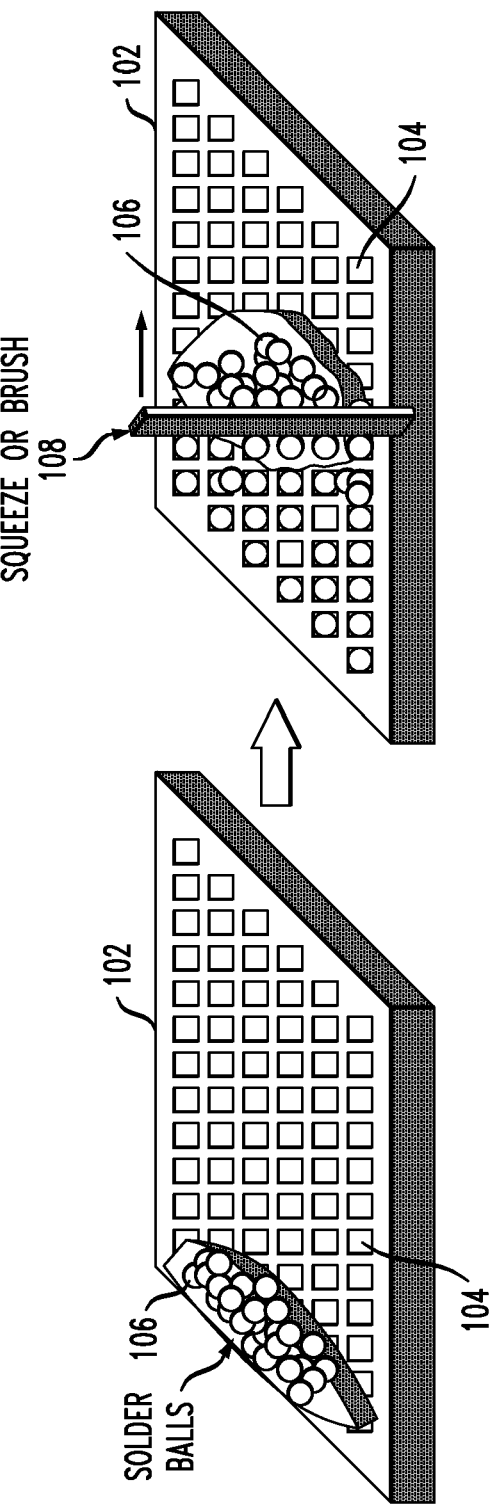
FIGS. 1 and 2 depict certain issues that may be encountered in the use of a squeeze brush, in the case where a current C4NP mold plate was employed directly.
Figure 2:
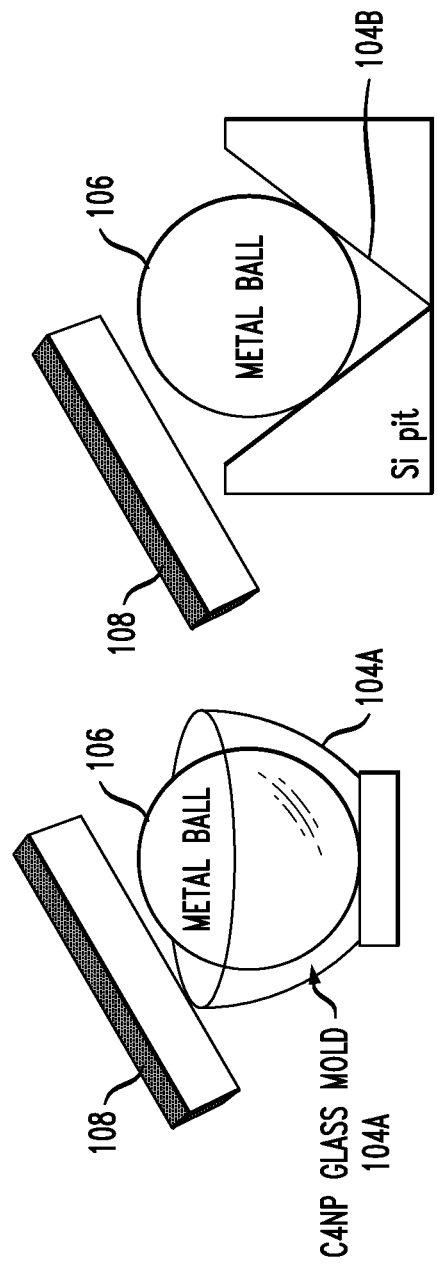

With reference to FIGS. 1 and 2, a current C4NP mold plate 102 could be directly used for the array of solder balls 106; however, to make good contact between the solder balls 106 and the input/output (I/O) pads on a semiconductor device after the array of solder balls is formed, the top surface of solder balls 106 should be over the surface of the mold plate 102. For direct dispensing of conductive balls 106 on the current mold plate 102, by using a squeeze brush 108 (or even an air knife), the squeeze brush 108 touches the already positioned balls 106 in the cavities 104 of the mold plate 102 during the dispensing process, as more than one pass of squeezing or brushing is typically needed for the array of solder balls 106. The same is true in the case of using an air knife. The undesirable touching is best seen in FIG. 2, which depicts alternate forms of cavities 104 including a glass mold cavity 104A and a silicon (Si) pit cavity 104B. Solder balls 106 can be applied in a dry state, or in some instances, in a liquid medium, A non-limiting example of a liquid medium is IPA (Isopropyl alcohol). Any suitable liquid can be used, in order to assist in keeping the balls from moving around. The liquid medium may, for example, be a liquid selected from the group consisting of a fluxing agent, water, alcohol, and a thermally degradable soluble polymeric adhesive. In some instances, water or alcohol are employed, rather than fluxing agent or adhesive, to achieve a fluxless, no adhesive process.

Accordingly, one or more embodiments of the invention provide techniques for arraying solder balls in the cavities of a mold plate for fluxless solder bumping processes on a semiconductor device.

Note initially that aspects of the aforementioned C4NP process are disclosed in U.S. Pat. Nos. 5,244,143; 5,775,569; and 7,332,424, the complete disclosures of which are expressly incorporated herein by reference in their entirety for all purposes (although the skilled artisan will already be familiar with same). C4NP employs formic acid during the solder bumping process on a semiconductor device, to achieve a fluxless process. The formic acid is a vapor phase but the flux is a liquid phase. Advantageously, the CTE (Coefficient of thermal Expansion) of a mold plate is matched to a silicon wafer and the mold holds the solder in position during the transfer process C4NP reduces wafer damage from corrosion and contamination, and void formation inside bumps is limited in C4NP, due to it being a fluxless dry process.

One or more embodiments of the invention provide a fluxless bumping method suitable for solders which have high melting temperature. The solder may comprise any solder suitable for flip chip interconnects and its melting temperature may be higher than 250° C., including, for example, Au—Sn (Sn can be over 20 weight %), Sn—Cu (Cu can be over 1.5 weight %), Sn—Ag (Ag can be over 5 weight %), Sn—Sb (Sb can be over 10 weight %), Sn—Zn (Zn can be over 30 weight %), Sn—Pb (Pb can be over 90 weight %), Sn—Ag—Cu (Sn plus 0 to about 1.5 weight % Cu plus over 5 weight % Ag, Sn plus 0 to about 3.9 weight % Ag plus over 1.5 weight percent Cu), and so on The solder may have a high melting point (high liquidus temperature) so that C4NP is not suitable because of the limitations of the sealing material. Aspects of the invention can be extended to techniques for arraying of any conductive balls in the position of input/output (I/O) pads on the wafer. Furthermore, all values given herein are exemplary and non-limiting, and, while believed advantageous fox high-temperature applications, techniques of the invention could be used for lower-temperature applications as well. For example, the solder compositions mentioned in this paragraph merely illustrate capabilities of one or more embodiments of the invention; techniques of the invention can be employed to different compositions as well.

Reference should now be had to FIG. 3 In one or more embodiments, a through hole mask 302 is used to assist the array of solder balls or conductive balls 106 on the cavities 104B of mold plates 102. Mask 302 may have flame 306. The total depth of the through holes 304 of the mask 302 plus the cavities 104B of the mold plate 102 is almost the same as the diameter of the conductive balls 106, so as to reduce the chance of, or prevent, touching the already-positioned balls 106 during the dispensing process, and so as to reduce the chance of, or eliminate, filling of more than one ball 106 in a cavity 104B Balls 106 preferably are recessed below the surface of mask 302 (or at most, substantially flush therewith), but as seen in FIGS. 4 and 7, stand above the surface of mold 102 when mask 302 is removed.

As seen in FIG. 4, after the array of conductive spheres 106 is placed in the cavities 104B of the mold plate 102, the through hole mask 302 is removed and the surface of the solder balls or conductive balls 106 extends out over the surface of the mold plate 102, which helps the contact of solder balls or conductive balls 106 with the I/O pads 314 in the semiconductor device 312. During the process of transferring the solder balls or conductive balls 106 from the mold plate 102 to the semiconductor device 312, formic acid enables employment of a fluxless solder-bumping method. The cavities 104B in the mold plate 102 can hold the position of the solder balls or conductive balls 106 during the mold handling, so that adhesive, such as flux, is not need in this exemplary process. FIG. 5 shows the finished product, with the balls 106 transferred to pads 314 of chip 312.

The process of transferring the solder balls from the mold plate 102 to the semiconductor device 312 in FIG. 4 involves bonding between the solder balls 106 and the pads 314. During the transfer process, the solder balls 106 melt and bond to the pads 314 by forming intermetallic compounds, which is known as a wetting reaction. However, both the solder balls 106 and the pads 314 have oxide layers on their surfaces. These oxide layers do not melt at the solder melting temperature. Therefore, formic acid is needed to remove the oxide layers and to shield both the solder balls 106 and the pads 314 against further oxidation.

In FIGS. 3 and 4, mask 302 may be, for example, glass, Si, ceramic, metal, or polymer, with through holes 304. Mold 102 may be silicon, with cavities in the form of pits 104B. Alternatively, as shown in FIGS. 6 and 7, a glass, Si, ceramic, metal, or polymer mold plate 102 with cavities 104A can be employed. Mask 302 can be similar. The final product can be similar to that shown in FIG. 5.

FIGS. 3-7 thus depict examples of a process flow for fluxless solder bump formation according to aspects of the present invention. The fluxless solder bump formation according to one or more embodiments of the present invention includes an alignment process between a through hole mask 302 and a mold plate 102, a dispersing of solder balls 106 into cavities 104A or 104B, an alignment process between mold plate 102 and wafer 312 (which can be done, for example, after lifting off the mask 302), and a fluxless reflow process under a formic acid environment, resulting in the finished product of FIG. 5.

In the solder ball dispensing process, the solder balls 106 are filled into the through holes 304 by, for example, one or mole of the motion of a squeeze brush 108, vibration of the mask 312, air flow from the top, and the like. Advantageously, in one or more embodiments, no adhesive (such as flux) is required, since the solder balls 106 are positioned inside the cavities 104A, 104B of the mold 102. The mold plate 102 enables retention of the solder balls during mold handling. The masks 302 may comprise glass, ceramic, Si, polymer, or any material in which the through holes can be made Each of the holes 304 can have a diameter similar to that of the solder balls. The diameter of each hole 304 should be in the range of about 100% to about 195% of the diameter of the solder ball 106. Only one solder ball should be located in one hole.

The mold plates 102 may be made from glass, silicon, or any material used for injection molded solder molds, and the like. Each of the cavities 104A, 104B can have a diameter similar to that of the solder balls. The top diameter of each cavity 104A, 104B should be in the range of about 100% to about 195% of the diameter of the solder ball 106 for the array of one solder ball in one cavity Only one solder ball should be located in one cavity The sum of the mask 302 thickness and the cavity 104A depth should be in the range of about 100% to about 195% of the diameter of the solder ball 106 for the array of one solder ball in one cavity. Only one solder ball should be located in one cavity.

The depth of cavity 104A should be in the range of about 30% to about 95% of the solder ball 106 for the safe positioning of the solder ball in the cavity and the surface of the solder balls 106 extends out over the surface of the mold plate 102.

In the case of cavity 104B, the wall angles of the pit should be controlled for only one solder ball should be located in one cavity and the surface e of the solder balls 106 extends out over the surface of the mold plate 102.

With regard to the preceding discussion, note that the diameter of each mask hole 304 or mold cavity 104 is related to the requirement that 'only one solder ball should be located in one cavity.' If the diameter of each mask hole 304 or mold cavity 104 is smaller than 100% of the ball diameter, the ball can not be located in the mold cavity. If the diameter of each mask hole 304 or mold cavity 104 is bigger than 200% of the ball diameter, more than one ball could be located in the mold cavity or mask hole. Further, the sum of the mask thickness and the cavity depth is related to the requirement that 'only one solder ball should be located in one cavity.' If the sum of the mask thickness and the cavity depth (not 104B but 104A) is over 200% of the ball diameter, more than one ball could be located in the mold cavity or mask hole. Yet further, the depth of the mold cavity is related to the requirement that 'the surface of the solder balls 106 should extend out over the surface of the mold plate 102.'

As noted, the combined depth of the holes 304 in mask 302 and the cavities 104A, 104B in molds 102 can be such that the solder balls are approximately flush with, or slightly recessed below, the surface of the mask 302 as seen in FIGS. 3 and 6.

In general terms, one or more techniques, according to aspects of the invention, can be employed to array any conductive balls so as to enable the conductive balls to be positioned at the same location as the I/O pads 314 of the semiconductor device 312, for the transfer of conductive spheres 106 from the mold plate 102 to the semiconductor device 312

Figure 8:
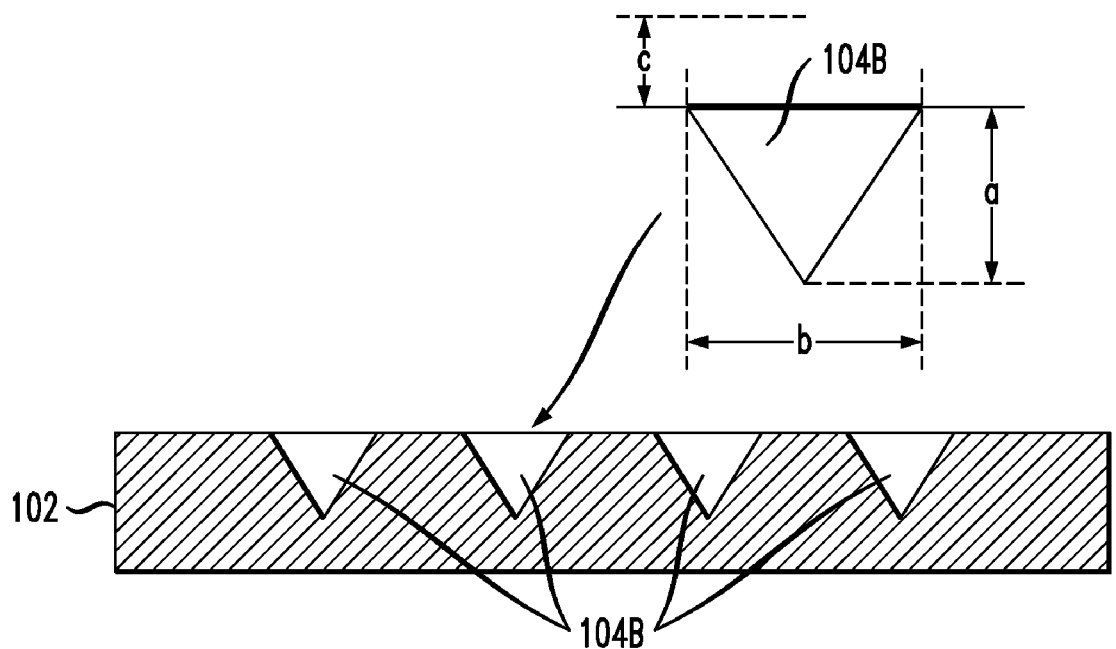
FIGS. 8-11 depict aspects of certain non-limiting exemplary embodiments.
Figure 11:
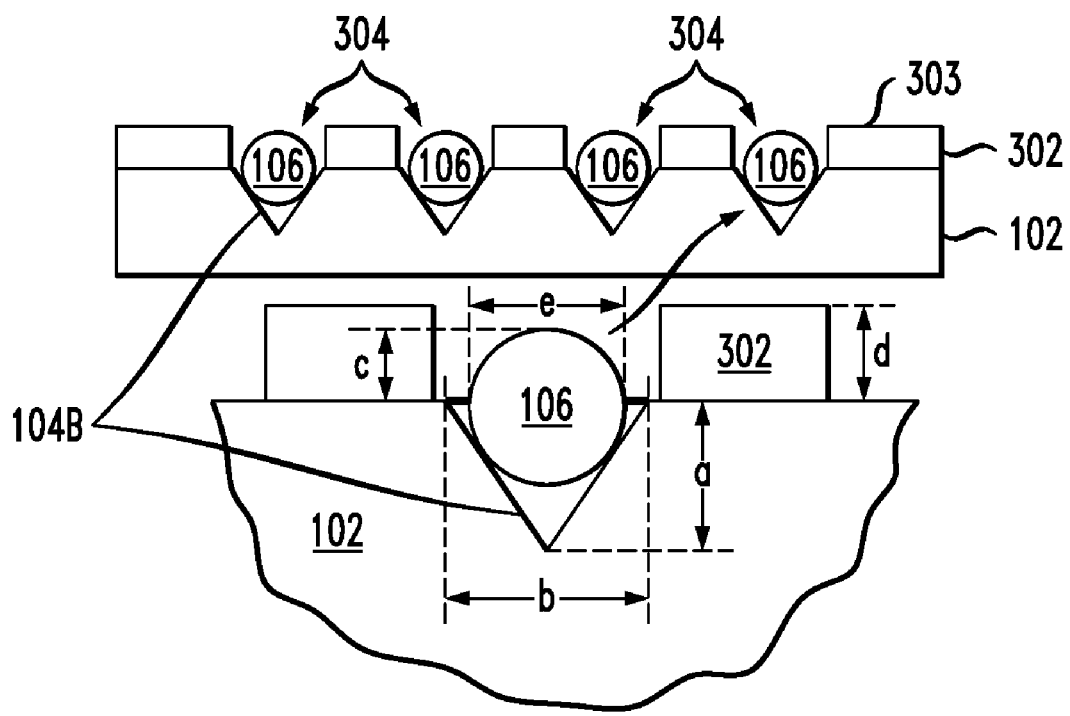

FIG. 8 shows Si mold 102 with cavities 104B including exemplary detail thereof. When the diameter of the solder ball 106 is "e," as best seen in FIG. 11, width "b" can be in the range from about e to about 2e, and dimension c, discussed further below with regard to FIG. 11, can be in the range from about 0 to about d. In a non-limiting example, presented purely for illustrative purposes, depth "a" can be about 93 microns, width "b" can be about 130 microns, and dimension "c" can be about 34 microns when the diameter of the solder ball "e" is about 100 microns.

In one or more embodiments, the depth of hole "a" in FIG. 11 is not related to "d" (mask thickness) In the case of cavity 104B (pit cavity), the solder ball 106 can not touch on the bottom of the cavity and "c" is only dependent on the tapered side wall angle of cavity 104B (pit cavity). However, in the case of 104A (round cavity), the solder ball 106 definitely touches on the bottom of the cavity and the sum of "a" and "d" should be in the range from about 0 to about "e."

Figure 9:
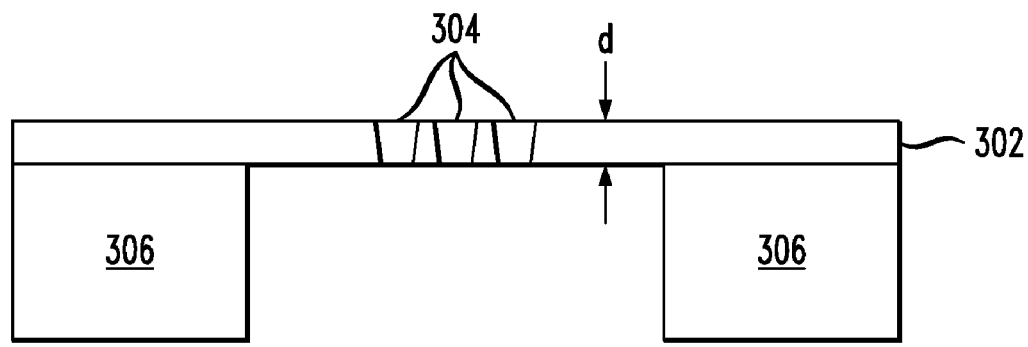

FIG. 9 shows an exemplary polymer mask 302 with through holes 304 and frame 306. A polymer film with thickness d of about 2 mils (0.002 inches or about 50 microns) can be employed, in one or mote non-limiting embodiments. Frame 306 can be made of any suitable substantially rigid material, for example, of Invar. The thickness "d" of the polymer film 302 can have a range of from about 0.5 mils (0.0005 inches or about 12.5 microns) up to about the diameter "e" of the solder ball 106.

Figure 10:
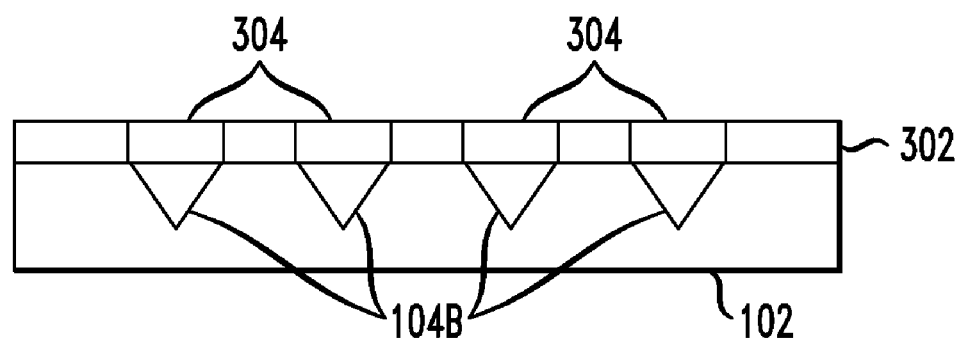

FIG. 10 shows mask 302 with holes 304 aligned with cavities 104B in mold 102. The alignment process may be carried out by, for example, using commercially available tools that use optical sensing of fiducials on mask 302 and mold 102. Note that section lines were included in FIG. 8 but are omitted from the other figures to avoid cluttering the drawings. FIG. 11 shows the array of balls 106 in the cavities 104B of mold plate 102 as well as in the through holes 304 of mask 302 The tops of the balls 106 are recessed below the surface 303 of mask 302. The dimensions a, b, c, d cab be as above—note that dimension c is the distance of the top of ball 106 above the surface of mold 102.

By way of review, an exemplary method, according to an aspect of the invention, includes the steps of providing a mask 302 having a plurality of through holes 304 and a mold 102 having a plurality of cavities 104A, 104B; aligning the through holes and the cavities; and dispensing conductive balls 106 into the aligned through holes and cavities. The alignment process may, as noted, be carried out using commercially available tools that use optical sensing of fiducials on mask 302 and mold 102. Substantially one ball (that is, exactly one ball, or one ball in most cavities with an occasional empty cavity or double-filled cavity, that results in an acceptable product yield) is dispensed into each aligned through hole and cavity, and the mask with the holes and the cavities in the mold are configured and dimensioned such that the balls are substantially flush with, or recessed below, an outer surface 303 of the mask 302. The mask is removed, as in FIGS. 4 and 7, and the conductive balls are aligned with pads 314 of a semiconductor device 312, and the conductive balls are transferred to the pads by fluxless reflow in a formic acid environment, resulting in the assembly depicted in FIG. 5 The alignment process may be carried out, for example, using commercially available bonding tools that employ optical sensing of fiducials on the surfaces to be aligned.

Figure 12:
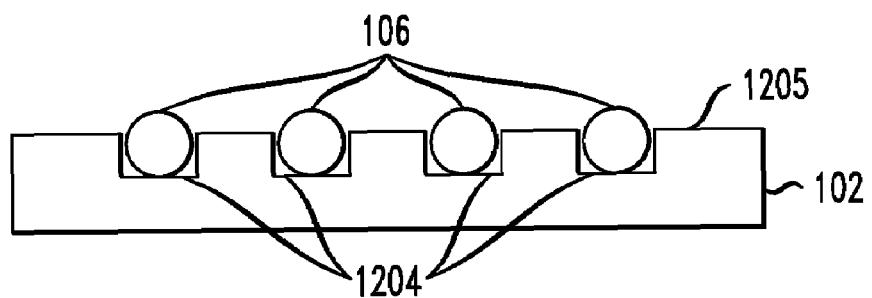
FIGS. 12-14 show steps in an exemplary vibrating mold embodiment, according to another aspect of the invention.

In another aspect, as seen in FIG. 12 a tipping and vibrating plate 102 without a through-holes mask can be used to form the array of solder balls or conductive balls in the cavities 1204 of the mold plate 102 The vertical side walls of cavities 1204 in mold plate 102 enable the solder balls 106 to be arrayed by using tipping and vibrating of mold plate 102. The arraying and handling of the solder balls is easy, and can be accomplished without the need for flux and vacuum pressure, because the centers of the balls 106 are located below the mold top surface 1205 (that is, the depth of cavities 1204 is greater than the radius of the balls 106).

Figure 13:
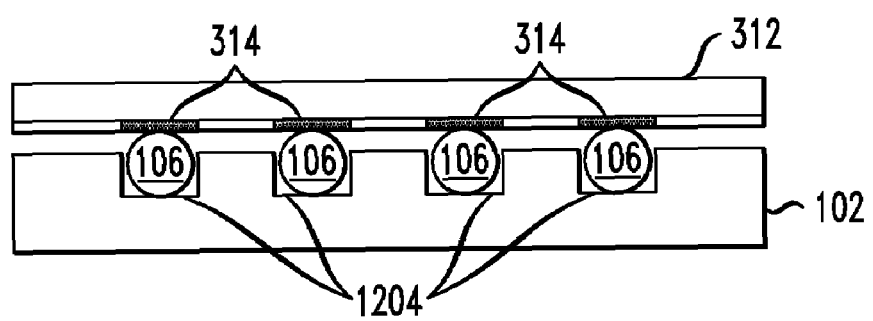
Figure 14:
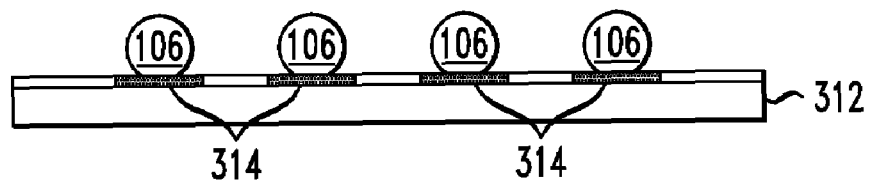

FIGS. 12-14 thus depict a tipping and vibrating alignment plate 102 without a through hole mask. The solder spheres 106 are filled in the cavities 1204 of the mold plate 102 by tipping and vibrating of the mold plate, as in FIG. 12. The mold plate may be tipped back and forth at an angle of between about 0 and about 45 degrees, with a +/−10 degree angle preferred. The mold may also be vibrated to ensure an even distribution of the solder balls and prevent ball conglomeration. After cavity fill, the mold is positioned on a semiconductor device 312 with I/O pads 314, as in FIG. 13, and then the solder balls 106 are transferred from the mold 102 to the semiconductor device 312 by the reflow process in a formic acid environment, without flux or adhesive. The mold plates 102 may comprise glass, silicon, or any material used for injection molded solder molds, and the like. Each of cavities 1204 can have dimensions similar to those of the solder spheres or conductive balls The mold cavities are preferably slightly larger (typically by several microns) than the solder balls to insure ball insertion. The side walls of the top of the cavity are preferably substantially vertical to ensure ball retention prior to solder transfer.

By way of review, an exemplary method, according to another aspect of the invention, includes providing a mold 102 having a plurality of cavities 1204; and dispensing conductive balls 106 into the cavities 1204, substantially one ball to each cavity, by tipping and vibrating the mold 102. The cavities 1204 in the mold are configured and dimensioned such that the balls 106 are substantially secured therein during the tipping and vibrating. The conductive balls are aligned with pads 314 of a semiconductor device 312; and the conductive balls 106 are transferred to the pads by fluxless reflow in a formic acid environment. Preferably, the cavities 1204 have substantially vertical side walls and a depth such that centers of the balls 106 are substantially below an outer surface of the mold 102.

In FIGS. 3-7 and 12-14, the cavities 104A, 104B, 1204 of the mold plate can have a pyramidal shape, vertical sidewalls, or other suitable configurations, which help with the retention of solder spheres or conductive spheres 106, depending on the etching methods used to form the mold. Further, a mold plate reflow may assist with handling prior to wafer transfer. After ball placement, the solder filled mold plate cavities may be reflowed (temperature elevated above the melting point of the solder), then cooled. The reflowed solder will exhibit an affinity for (adhesion to) the mold surface, which will assist with mold plate handling (and prevent accidental ball fall out) prior to wafer transfer.

Figure 15:
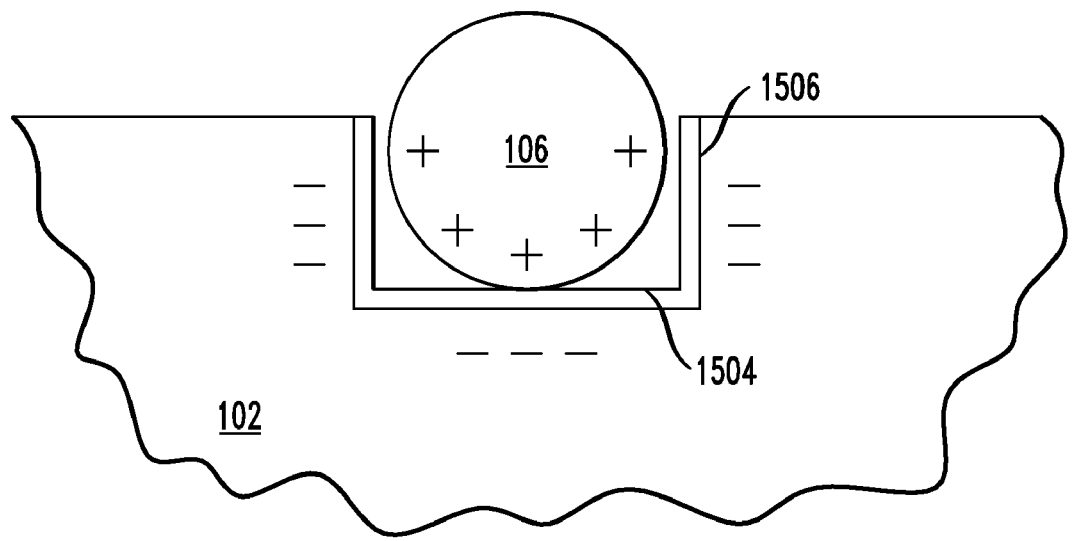
FIGS. 15 and 16 show first and second exemplary electrostatic techniques, according to further aspects of the invention.
Figure 16:
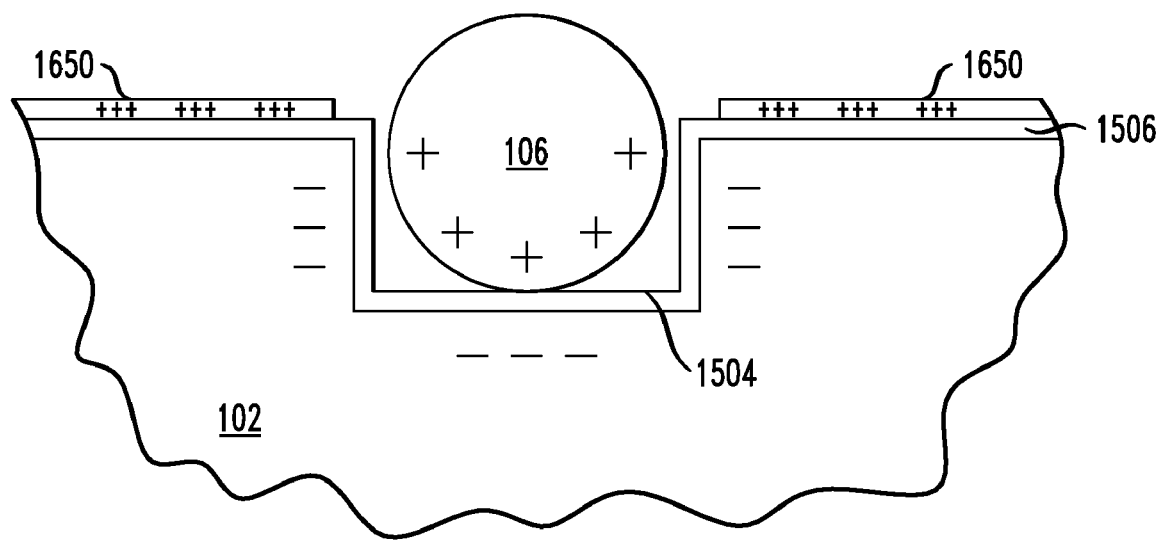

According to another aspect of the invention, an exemplary electrostatic method (which does not require a through hole mask) can be used to form the array of solder balls or conductive balls 106 in the cavities 1504 of the mold plate 102 as shown in FIGS. 15 and 16. The solder spheres or conductive spheres 106 can be self aligned to desired mold locations 1504 as the solder spheres or conductive spheres 106 are charged to plus (+) and the cavities of mold plate are charged to minus (−). If desired, the opposite scheme could be used (negative balls and positive mold).

In one or more embodiments, one solder ball mold plate 102 could be an undoped (or lightly doped) silicon or glass wafer that provides a highly resistive path to charge movement. If it is desirable to further improve the mold's resistivity, an additional oxide 1506 can be thermally grown on the silicon mold (this can be done quite economically), or deposited on the silicon or glass mold 102 so that the highly resistive (insulating) oxide 1506 separates the mold plate from the second object (ball 106). The mold plate 102 can be charged up in various ways, such as rubbing with a cloth, or charged via an ion generator. In addition, the mold plate 102 can be selectively discharged by various techniques, such as applying a potential, or through the photoelectric effect—the emission of electrons from a surface (usually metallic) upon exposure to, and absorption of, electromagnetic radiation (such as visible light and ultraviolet radiation). This would be particularly beneficial in the case of metallic keep-out zones on the mold 102, as discussed below with regard to FIG. 16

It is preferable from an electrostatic discharge (ESD) as well as electromagnetic induced (EMI) noise point of view for surrounding electronics and chips to keep the mold plate discharged and tied to a common potential or ground when not holding or attracting solder balls, since in general, this would minimize potential ESD discharge and resulting damage, and minimize electrical noise pickup and radiation. However, if the mold plate is left floating, it may not be ideal for the ESD or EMI minimization, but would function when charged to a known potential for attracting the solder balls. A further consideration in the pie-charging time or the post dis-charging time is the quality of the insulator, whether if be the glass mold itself, another deposited or grown thin film such as an oxide layer, and the like. The more ideal the insulator, that is, the more resistive the quality of the insulator, the lower the charge leakage or bleed-off rate will be until the mold or thin film is intentionally discharged.

Consider relatively conductive solder balls. To avoid discharging the mold plate, and hence, loss of attraction of the (conductive) solder balls to the mold plate, it is necessary to isolate the conductive balls from the conductive portion of the mold plate. In principle, this is accomplished by placing an insulator between the conductive solder balls and the mold plate. For example, the mold plate may be of an insulating material, or contain a thin insulator coating. There are various economical methods of depositing thin, uniform, large area, very good quality insulating materials such as oxides, nitrides, and the like, using such tools employing thin film deposition methods as chemical vapor deposition, and so on.

With attention now to FIG. 16, a further refinement, which may be employed in one or more embodiments of the invention, is the deliberate placement of keep-out zones 1650 for the solder balls on the mold 102 so that self assembly of the solder balls 106 to desired mold locations 1504 occurs. This self-assembly can be hastened by mechanical aids such as vibration, brushing, and the like. The keep-out zones 1650 may be formed by first depositing a blanket and conductive metal, spinning on an ultraviolet (UV) sensitive photoresist, UV exposure, and developing, followed by metal etching, and photoresist removal. The remaining metal in the keep-out zone 1650 would be charged to the same polarity as the metal solder balls 106 (in this example, both are positive, but in other embodiments, both could be negative). The magnitude of the repulsive force between the same-polarity surfaces is directly proportional to the magnitude of the charges on the keep-out zones and the solder balls, and inversely proposional to the square of the distance between them.

By way of review, still another exemplary method includes providing an electrically resistive mold 102 having a plurality of cavities 1504; and dispensing conductive balls 106 into the cavities, substantially one ball to each cavity, by charging the balls to a first polarity and the mold to a second polarity different than the first polarity. An additional step includes aligning the conductive balls with pads of a semiconductor device (similar to what was depicted in FIG. 13), while a further step includes transferring the conductive balls to the pads by fluxless reflow in a formic acid environment (to obtain a result similar to FIG. 14). Optionally, the mold has keep-out zones 1650 between the cavities 1504, and an additional step includes charging the keep-out zones 1650 to repel the balls 106.

According to still another aspect, in one or more embodiments of the invention (see, for example, FIGS. 17-19), the mask 1702 has substantially the same CTE as the wafer. Substantially the same means identical, or sufficiently close to allow mask 1702 to function as described with regard to FIGS. 17-19. For example, Si or C4NP glass masks can be used to directly arrange an array of solder balls 106 on the I/O pads 314 in the wafer 312, as shown in FIGS. 17-19. The though hole mask 1702 holds the position of solder balls 106 during the fluxless reflow process, and the mask is removed after the formation of solder bumps (bumps refer to solder balls attached to the wafer contacts 314) on the pad I/Os 314 in the wafer 312. The depth of through holes 1704 are almost the same as the diameter of solder balls 106, so as to reduce or prevent the squeeze brush touching the already-positioned balls 106, and to reduce or prevent more than one solder ball 106 adjacent a single I/O 314 on the wafer 312. The masks 1702 may be formed, for example, from glass, ceramic, Si, polymer, or any material in which through holes 1704 can be made and which has a CTE substantially similar to that of the wafer 312. CTE matching is of interest because when the wafer and mask are heated during solder reflow, a differential thermal expansion between the parts would move the solder balls off the Bottom Level Metal (BLM) pads, which would be undesirable. For example if the BLM/ball pitch is 400 microns, then the differential thermal expansion between parts during reflow should be less than about 10 to about 50% of the BLM pad/ball pitch.

Thus, FIGS. 17-19 depict direct formation of an array of solder balls 106 on the I/O pads 314 on the semiconductor device 312, followed by solder bump formation. In particular, fluxless solder bump formation can proceed as follows. First, an alignment process can be carried out between the through holes 1704 of the mask 1702 and the I/O pads 314 on the wafer. Next, the solder balls 106 are filled into the through holes 1704. In the solder ball dispensing process, one or more of the motion of the squeeze blush 108, vibration of the mask 1702, air flow from the top (in general, from a location outward of the mask, mold and/or balls, depending on the embodiment), and the like, can be used. After the completion of the dispersing of solder balls into the through holes, solder balls are reflowed in a formic acid environment, without flux or adhesive, as in FIG. 18. Note that FIG. 18 appears similar to FIG. 17 because the formic acid in FIG. 18 is in the vapor phase and not amenable to illustration. After the fluxless reflow process, the mask is pulled up from the wafer, resulting in the finished product in FIG. 19. The masks may comprise glass, silicon, or any material which has a similar CTE with the wafer (the wafer is typically Si) Once again, by way of review, yet another exemplary method includes providing a mask 1702 having a plurality of through holes 1704; and aligning the through holes with pads 314 of a semiconductor device 312. The mask and the semiconductor device have substantially similar coefficients of thermal expansion A further step includes dispensing conductive balls 106 into the holes, substantially one ball to each hole, the through holes 1704 being configured and dimensioned such that the balls are substantially flush with, or recessed below, an outer surface 1705 of the mask 1702. An additional step includes transferring the conductive balls to the pads by fluxless reflow in a formic acid environment, in FIG. 18, resulting in the structure of FIG. 19.

One or more embodiments may advantageously include one or more of the following features and benefits: no need for concern with viscosity, proper thickness and type of flux to keep solder balls stuck in place before wafer reflow; application even to very fine pitch applications (under 100 µm); no need for vacuum pressure; no need for concern with fluid mechanic issues as balls drop through a liquid medium, as in some prior art approaches; no need for polymeric fixing agent and protective sheet for solving the handling issue after arranging solder balls; and no need for adhesion via flux or other material, such as solder paste or conductive adhesive.

The methods described above can be used in the fabrication and packaging of integrated circuit chips; in particular, techniques set forth herein can be used to make arrays of solder balls for attachment to an integrated circuit chip. The chip design can be created, for example, in a graphical computer programming language, and stored in a computer storage medium (such as a disk, tape, physical hard drive, or virtual hard drive such as in a storage access network) If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GD-SII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections) In any case, the chip may then be integrated with other chips, discrete circuit elements and/or other signal processing devices as part of either (a) an intermediate product, such as a mother board, or (b) an end product The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising the steps of:
providing a mask having a plurality of through holes and a silicon mold having a plurality of cavities;
aligning said through holes and said cavities;
dispensing preformed conductive balls into said aligned through holes and cavities, said preformed conductive balls having a diameter e, substantially one preformed conductive ball to each aligned through hole and cavity, said cavities of said mold comprising pits having an opening diameter ranging from about e to about 2e and having tapered side walls with a tapered side wall angle controlled such that upon removal of said mask from said mold, said preformed conductive balls extend beyond said outer surface of said mold and are immobile in said mold, said mask with said holes and said cavities in said mold being configured and dimensioned such that:
said preformed conductive balls are one of substantially flush with, and recessed below, an outer surface of said mask under conditions of said alignment of said through holes and said cavities; and
upon removal of said mask from said mold, said preformed conductive balls extend beyond an outer surface of said mold;
removing said mask from said mold so that said preformed conductive balls extend beyond said outer surface of said mold;
aligning said preformed conductive balls with pads of a semiconductor device; and
transferring said preformed conductive balls to said pads by fluxless reflow in a formic acid environment.

2. The method of claim 1, wherein said preformed conductive balls comprise solder balls with a liquidus temperature of at least about 250 degrees Centigrade.

3. The method of claim 2, wherein said dispensing comprises at least use of a squeeze brush.

4. The method of claim 2, wherein said dispensing comprises at least vibration of said mask and mold.

5. The method of claim 2, wherein said dispensing comprises at least air flow from a location outward from said mask.

6. The method of claim 2, wherein said mask is formed from at least one of glass, ceramic, silicon, and polymer.

7. The method of claim 2, wherein said mold is formed from at least one of glass and silicon.

8. The method of claim 2, wherein said preformed conductive balls have a diameter and wherein said through holes have a diameter of about 100 percent to about 195 percent of said diameter of said balls.

9. A method comprising the steps of:
providing a mask having a plurality of through holes and a glass mold having a plurality of cavities;
aligning said through holes and said cavities;

dispensing preformed conductive balls into said aligned through holes and cavities, said preformed conductive balls having a diameter e, substantially one preformed conductive ball to each aligned through hole and cavity, said cavities of said mold comprise rounded cavities having a depth of from about thirty percent of e to about ninety five percent of e, said mask with said holes and said cavities in said mold being configured and dimensioned such that:

said preformed conductive balls are one of substantially flush with, and recessed below, an outer surface of said mask under conditions of said alignment of said though holes and said cavities; and upon removal of said mask from said mold, said preformed conductive balls extend beyond an outer surface of said mold;

removing said mask from said mold so that said preformed conductive balls extend beyond said outer surface of said mold;

aligning said preformed conductive balls with pads of a semiconductor device; and transferring said preformed conductive balls to said pads by fluxless reflow in a formic acid environment.

10. The method of claim 9, wherein said preformed conductive balls comprise solder balls with a liquidus temperature of at least about 250 degrees Centigrade.

11. The method of claim 9, wherein said dispensing comprises at least use of a squeeze brush.

12. The method of claim 9, wherein said dispensing comprises at least vibration of said mask and mold.

13. The method of claim 9, wherein said dispensing comprises at least air flow from a location outward from said mask.

14. The method of claim 9, wherein said mask is formed from at least one of glass, ceramic, silicon, and polymer.

15. The method of claim 9, wherein said mold is formed from at least one of glass and silicon.

16. The method of claim 9, wherein said preformed conductive balls have a diameter and wherein said through holes have a diameter of about 100 percent to about 195 percent of said diameter of said balls.

* * * * *